United States Patent
Stern

(10) Patent No.: US 7,769,569 B2
(45) Date of Patent: Aug. 3, 2010

(54) METHOD AND SYSTEM FOR DESIGNING A STRUCTURAL LEVEL DESCRIPTION OF AN ELECTRONIC CIRCUIT

(75) Inventor: Michael Stern, Tel Aviv (IL)

(73) Assignee: Logiccon Design Automation Ltd., Tel Aviv (IL)

( * ) Notice: Subject to any disclaimer, the term of this patent is extended or adjusted under 35 U.S.C. 154(b) by 725 days.

(21) Appl. No.: 11/574,667

(22) PCT Filed: Sep. 1, 2005

(86) PCT No.: PCT/IL2005/000935

§ 371 (c)(1),
(2), (4) Date: Mar. 2, 2007

(87) PCT Pub. No.: WO2006/025062

PCT Pub. Date: Mar. 9, 2006

(65) Prior Publication Data

US 2008/0015838 A1  Jan. 17, 2008

Related U.S. Application Data

(60) Provisional application No. 60/606,425, filed on Sep. 2, 2004.

(51) Int. Cl.
*G06F 17/50* (2006.01)
*G06F 13/00* (2006.01)

(52) U.S. Cl. .............. 703/2; 703/14; 703/24; 716/4; 716/5

(58) Field of Classification Search .......... 703/2, 703/14, 24; 716/3–5
See application file for complete search history.

(56) References Cited

U.S. PATENT DOCUMENTS

| | | | |
|---|---|---|---|
| 5,537,580 A | 7/1996 | Giomi et al. | |
| 6,415,420 B1 | 7/2002 | Cheng et al. | |
| 6,421,808 B1 | 7/2002 | McGeer et al. | |
| 6,557,160 B2 | 4/2003 | Shalish | |
| 6,591,403 B1 | 7/2003 | Bass et al. | |
| 6,597,664 B1 | 7/2003 | Mithal et al. | |
| 6,604,232 B2 | 8/2003 | Okada et al. | |
| 6,675,359 B2 | 1/2004 | Gilford et al. | |
| 7,383,166 B2 * | 6/2008 | Ashar et al. | 703/14 |
| 2004/0139153 A1 * | 7/2004 | Heidenreich | 709/203 |
| 2005/0289486 A1 * | 12/2005 | Caron et al. | 716/3 |

FOREIGN PATENT DOCUMENTS

WO  2004/084086 A1  9/2004

* cited by examiner

*Primary Examiner*—Thai Phan
(74) *Attorney, Agent, or Firm*—Brooks Kushman P.C.

(57) ABSTRACT

A method and system for designing a structural level description of an electronic circuit with functional behavior described by a plurality of rules, the circuit being specified by data path and control path elements wherein at least one control path element is provided in a form of unresolved variable. The design comprises extracting a plurality of unresolved variables among the control path elements and automatic processing of data path and control path elements for accomplishing a state machine formulation, wherein the states of the state machine include states representing at least combinations of unresolved variables and corresponding transitions satisfying said plurality of rules and predefined design criteria.

28 Claims, 6 Drawing Sheets

3 - Last flow
4 - Wait for flow
7 - Active flow

```
structure}
    DO =>    DI  ,P1;              (1)
    DO) ,       VO;(                (2)
    DONE <= P3.e;                   (3)
}
601
control}
    P1  :GO  ,   virtual: VI && RO , END;   (4)
    P3  :P1.e! ,              , DO.v;       (5)
}
602
attributes}
    coherency (DO:( stream;         (6)
    validity)  GO:( out_of (GO, DONE;(      (7)
}
603
```

Figure 6

METHOD AND SYSTEM FOR DESIGNING A STRUCTURAL LEVEL DESCRIPTION OF AN ELECTRONIC CIRCUIT

CROSS-REFERENCE TO RELATED APPLICATION

This application claims the benefit of U.S. provisional application Ser. No. 60/606,425 filed Sep. 2, 2004.

FIELD OF THE INVENTION

This invention relates to the field of computerized electronic circuit design and, more particular, to high-level synthesis of structural (e.g. RTL) design description.

BACKGROUND OF THE INVENTION

Typical circuit design methodology involves providing an abstracted description of the circuit and transforming it into a physical layout with an aid of a synthesis tool(s). Generally, the design flow involves various levels of design abstraction and corresponding deriving steps, as will be further detailed with reference to FIG. 1. This process is time consuming and is subject to human error. The rapidly increasing complexity of modern electronic circuit architecture has often forced designers to employ computer-aided techniques.

The problem to automate the transformation from system description to physical layout has been recognized in prior art and various systems and methods have been developed to provide a solution.

For example, U.S. Pat. No. 5,537,580 (Giomi et al.) discloses a method for fabricating an integrated circuit including the steps of: (a) describing the functionality of an integrated circuit; (b) extracting a register level state machine transition table of the state machine from the hardware description language; (c) generating a logic level state transition table representing the state machine from the register level state machine description; (d) creating a state machine structural netlist representing the state machine from the logic level state transition table; and (e) combining the state machine structural netlist with an independently synthesized structural netlist to create an integrated circuit structural netlist including the state machine to provide a basis for chip compilation, mask layout and integrated circuit fabrication. The method results in a synchronous state machine being extracted from a register-transfer (RT) level representation.

U.S. Pat. No. 6,415,420 (Cheng et al.) discloses a method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising producing a graph structure in the storage medium by providing a path origination node in the storage medium; providing a path destination node in the storage medium; producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure; associating respective complete paths with respective control statements associated in the CDFG with corresponding branches that have been concatenated with other corresponding branches to produce such respective complete paths; and traversing respective complete paths of the graph information structure to determine whether there is a respective path that is not associated with a respective control statement.

U.S. Pat. No. 6,421,808 (McGeer et al.) discloses hardware design language V++. V++ provides an automatically designed and implemented communications protocol, embedded by a compiler in the design itself. This protocol permits transparent, automatic communication between modules in a hardware design. The protocol generalizes current design practice and impacts neither the cycle time, nor the area, of a typical system. Incorporating this protocol in the language itself frees the designer from the task of writing communications code, and ensures that two communicating modules follow the same low-level protocol. In V++ each program is directly interpreted as a network of communicating finite state machines. The composition of two V++ programs is a V++ program, with well-defined, deterministic semantics.

U.S. Pat. No. 6,557,160 (Shalish) discloses a system and method for providing correlation of HDL signal names in the structural gate level description. In one embodiment, an HDL behavioral description of a circuit is processed by a correlation compiler to identify intermediate signals. The behavioral description is modified to specify that the intermediate signals are primary outputs of the circuit. The modified behavioral description is then processed by a synthesis tool to generate a structural description corresponding to the modified behavioral description. The structural description includes as outputs the identified intermediate signals.

U.S. Pat. No. 6,591,403 (Bass et al.) discloses a method and system in support thereof, for specifying hardware description language assertions targeting a diverse set of verification tools to provide verification of a logic design by the set of verification tools. The constraints and properties of the logic design are described in the HDL using one or more high-level assertion specification macros representative of the assertions of the logic design. The one or more assertion specification macros are stored as components within a specification macro library for later retrieval as needed. Upon reading original HDL source code containing assertion macro calls to the assertion specification macros, a specification macro processor accesses the definitions of the assertion macros stored, if contained within a definition library, and uses these definitions as templates to automatically write expansion HDL code into the HDL source code and to automatically store tool-specific HDL code into corresponding tool-specific modules libraries for later use by one or more verification tools. If definitions of one or more of the assertion macros are not contained with the definition library, they may be written as needed.

U.S. Pat. No. 6,597,664 (Mithal et al.) discloses a method for specifying and synthesizing a synchronous digital circuit by first accepting a specification of an asynchronous system in which stored values are updated according to a set of state transition rules. For instance, the state transition rules are specified as a Term Rewriting System (TRS) in which each rule specifies a number of allowable state transitions, and includes a logical precondition on the stored values and a functional specification of the stored values after a state transition in terms of the stored values prior to the state transition. The specification of the asynchronous circuit is converted into a specification of a synchronous circuit in which a number of state transitions can occur during each clock period. The method includes identifying sets of state transitions, for example by identifying sets of TRS rules, that can occur during a single clocking period and forming the specification of the synchronous circuit to allow any of the state transitions in a single set to occur during any particular clocking period.

U.S. Pat. No. 6,604,232 (Okada et al.) discloses a high-level synthesis method comprising the steps of converting an operating description describing one or more operations to a control data flow graph (CDFG) including one or more nodes representing the one or more operations and one or more I/O branches representing a flow of data, scheduling the CDFG obtained by the converting step, and allocating one or more logic circuits required for executing the CDFG obtained by the scheduling step. A portion of the CDFG in the converting step is subjected to logical synthesis in advance to generate a node, and the portion of the CDFG is replaced with that node.

U.S. Pat. No. 6,675,359 (Gilford et al.) discloses a method and apparatus for recognizing a state machine in circuit design in a high-level IC description language. The present invention analyzes high-level IC description language code, such as VHDL and Verilog®, of an IC design and extracts description information corresponding to a state machine. The description information can be, for example, the high-level IC description language code corresponding to the state machine, a state diagram of the state machine, a state table for the state machine, or other representation of the state machine. In one embodiment, the present invention identifies a set of one or more processes as defined by VHDL "process" statements. By identifying one or more clocked processes, one or more transition processes, and one or more output processes, the present invention provides a state machine summary to describe the state machine identified in the high-level IC description language code.

International Publication No. WO2004/084086 (Möhl et al.) discloses a method for generating descriptions of digital logic from high-level source code specifications is disclosed. At least part of the source code specification is compiled into a multiple directed graph representation comprising functional nodes with at least one input or one output, and connections indicating the interconnections between the functional nodes. Hardware elements are defined for each functional node of the graph and for each connection between the functional nodes. Finally, a firing rule for each of the functional nodes of the graph is defined.

SUMMARY OF THE INVENTION

As any mistake on a step of structural (e.g. register transfer level) design may drastically affect the accuracy of the whole design flow, it would clearly be beneficial to ensure consistency of derived circuit structure.

According to some aspects of the present invention, there is provided a method of designing a structural level description of an electronic circuit, the method comprising:
 (a) obtaining data path and control path elements specifying the electronic circuit, wherein at least one control path element is provided in a form of unresolved variable;
 (b) obtaining plurality of rules;
 (c) extracting a plurality of unresolved variables among the control path elements;
 (d) automatic processing of data path and control path elements for obtaining values of unresolved variables satisfying said plurality of rules and predefined design criteria.

According to further aspects of the present invention, automatic processing may be provided for accomplishing a state machine formulation, wherein the states of the state machine include states representing at least combinations of unresolved variables and corresponding transitions satisfying said plurality of rules and predefined design criteria.

According to further aspects of the present invention, there is provided a system for designing a structural level description of an electronic circuit with functional behavior described by a plurality of rules, the circuit being specified by data path and control path elements wherein at least one control path element is provided in a form of unresolved variable; the system comprising a processor for automatic processing of data path and control path elements for accomplishing a state machine formulation, wherein the states of the state machine include states representing at least combinations of unresolved variables and corresponding transitions satisfying said plurality of rules and predefined design criteria.

According to further aspects of the present invention, the automatic processing may further comprise:
 (a) asserting probable values for unresolved variables among the plurality of unresolved variables and specifying potential combinations of said values;
 (b) specifying data path elements being controlled by said plurality of unresolved variables;
 (c) validating, in respect of each of the specified combinations of values of unresolved variables among the plurality of the unresolved variables, whether said data path elements comply with said plurality of rules and predefined design criteria and, thus giving rise to valid combinations of values of the plurality of unresolved variables to be specified in states of said state machine.

According to further features of the present invention, the automatic processing may comprise:
 (a) asserting probable values for unresolved variables among the plurality of unresolved variables and specifying potential combinations of said values;
 (b) specifying data path elements being controlled by said plurality of unresolved variables;
 (c) defining combinations of resulting states of the data path elements in respect of each specified combination of values of the plurality of unresolved variables in accordance with the plurality of rules;
 (d) validating, in respect of each specified combination of values of unresolved variables among the plurality of unresolved variables, if the corresponding combination of said resulting states of the data path elements meet predefined design criteria, thus giving rise to valid combinations of values of the plurality of unresolved variables to be specified in states of said state machine.

According to further aspects of the present invention, the predefined design criteria comprise criterion of logic contradiction; criterion of data integrity; and criterion of design flow enabling.

Thus, the present invention, in some of its aspects, is aimed to provide a novel solution capable of facilitating correctness—preserving educing of the structural level design.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 6 illustrates meta-language description of functional behavior rules in accordance with certain embodiments of the present invention.

DETAILED DESCRIPTION OF EXEMPLARY EMBODIMENTS

Figure 1:
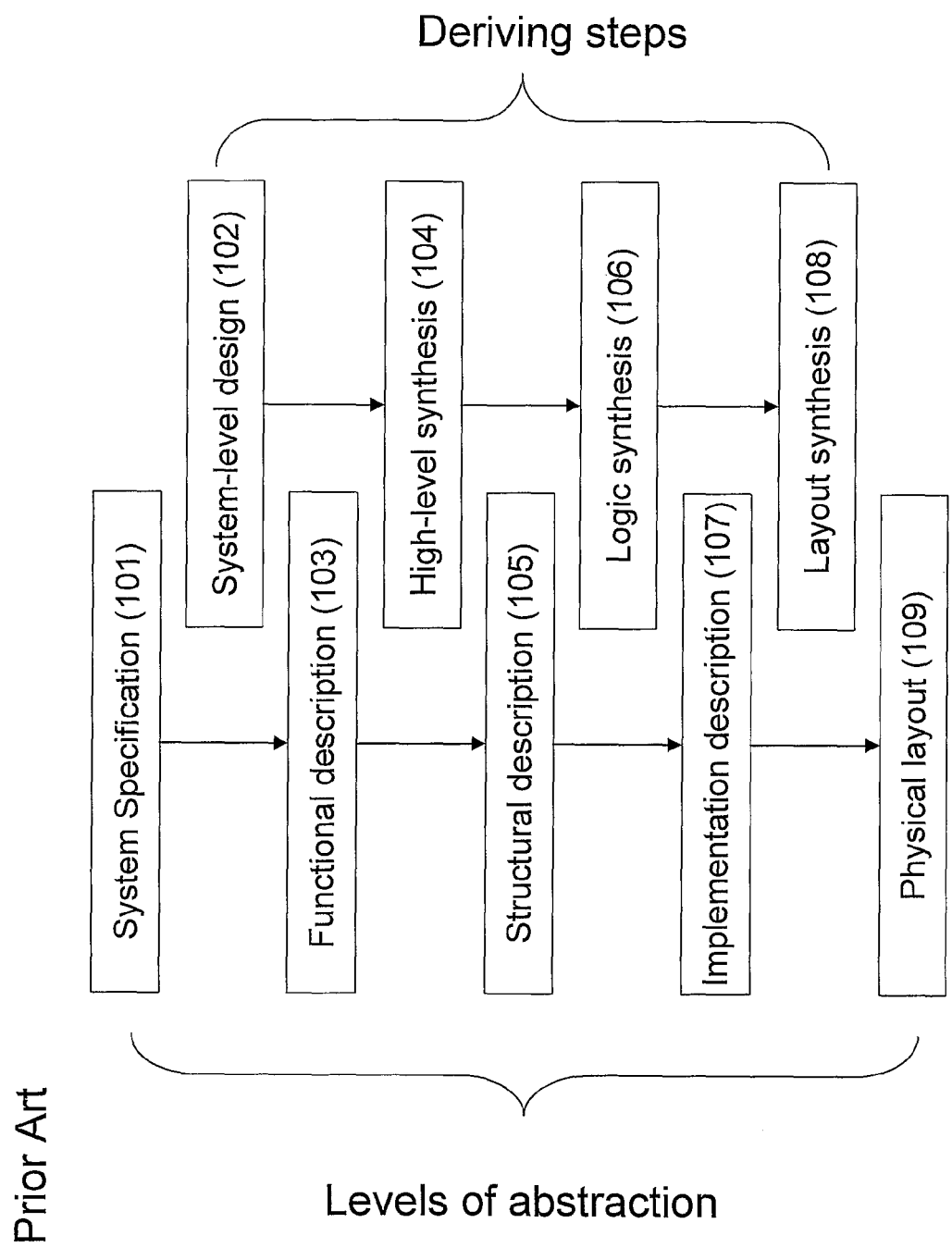
FIG. 1 illustrates a typical electronic circuit design flow as known in the art.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail, so as not to obscure the present invention. In the drawings and description, identical reference numerals indicate those components that are common to different embodiments or configurations.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or processor or similar electronic computing device, that manipulate and/or transform data represented as physical, such as electronic, quantities within the computing system's registers and/or memories into other data, similarly represented as physical quantities within the computing system's memories, registers or other such information storage, transmission or display devices.

Bearing this in mind, attention is drawn to FIG. 1 illustrating a typical electronic circuit design flow as known in the art (e.g. see R. Namballa et al. "Control and Data Flow Graph Extraction for High-Level Synthesis" IEEE Computer Society Annual Symposium on VLSI, 2004). The design flow involves various levels of design abstraction. The highest level of the design abstraction is a system level specification 101, which mostly gives its description in a plain natural language. The next, lower level is a functional description 103 which specifies the functions of the electronic circuit (e.g. operations, order and dependences thereof) while avoiding the structural details. The next abstraction level is a structural description 105 (e.g. register transfer level (RTL) description), which provides the structuralism of the design and comprises instances of modules (e.g. adders, multipliers, registers, etc.) and interconnections thereof. The next level of abstraction is an implementation description 107 (e.g. list of logic gates and the interconnections between them) resulting in a netlist. A physical layout 109 virtually places the netlist on a wafer. Introduced in the system description, the behavior view (i.e. description of system behavior) of the electronic circuit may be further detailed at the lower levels of abstraction (e.g. as a set of rules and conditions in the functional description, finite state machines at the structural and implementation levels of abstraction, etc.). Generally, the structural and lower-level descriptions are composed by writing code in a Hardware Description Language (HDL). For that purpose there are several languages known in the art, common among them being Verilog and VHDL, but other syntaxes may be used.

Accordingly, the process of translating the system specification into a hardware circuit exhibiting the described behavior may comprise at least the following steps:

a system-level design 102 of the functional description from the system description;

a high-level synthesis 104 of the structural (e.g. RTL) description from the functional description;

a logic level synthesis 106 resulting in the implementation (e.g. gate level) description, and a layout synthesis 108 emulating a real physical location of the registers and gates, e.g. viewing them on a screen or by printable drawings.

Note that the invention is not bound by the specific design flow described with reference to FIG. 1. Those versed in the art will readily appreciate that the invention is, likewise, applicable to any design flow comprising educing of the structural level design.

Figure 2:
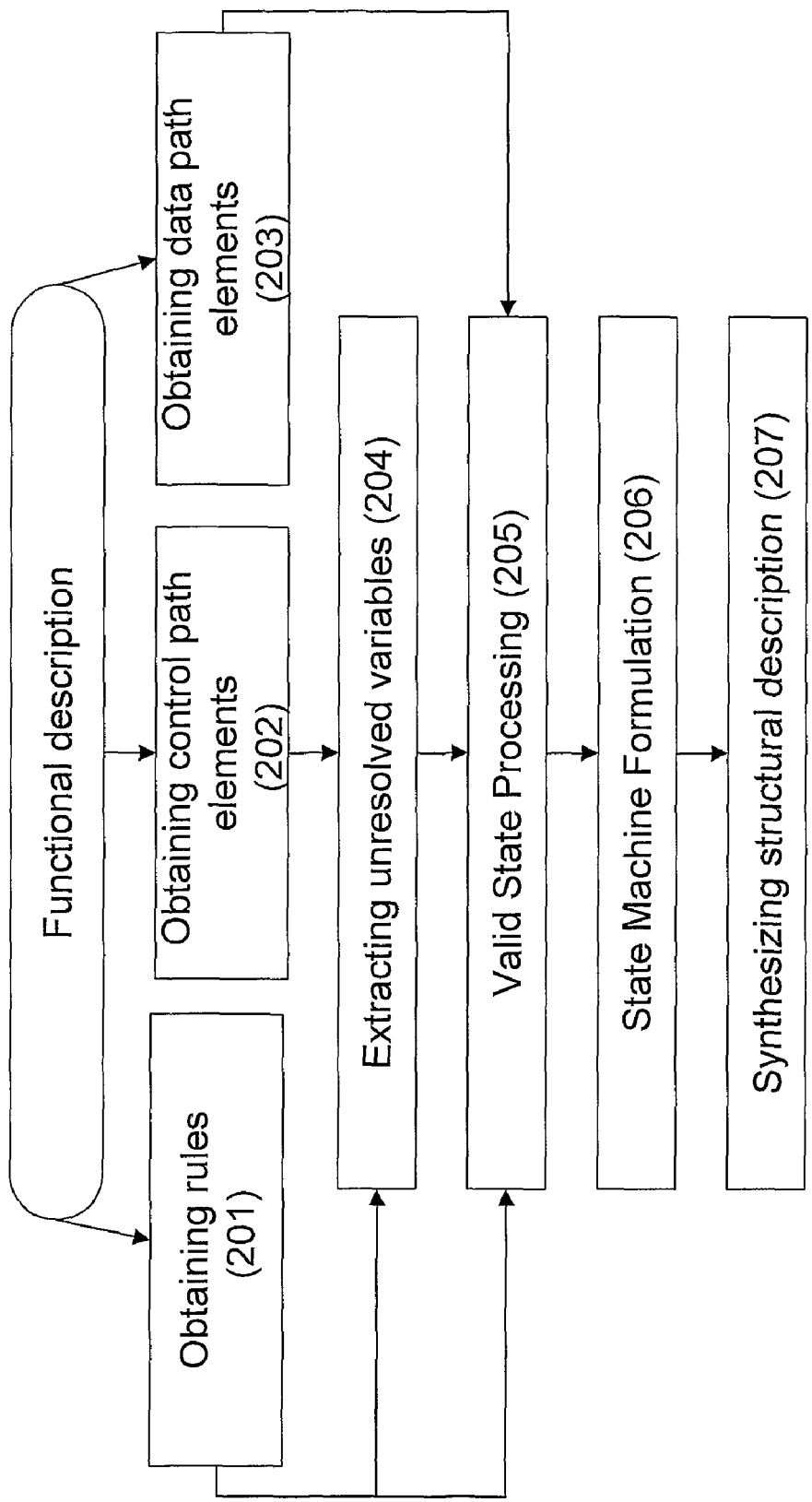
FIG. 2 illustrates a process of high-level synthesis in accordance with certain embodiments of the present invention.

Bearing this in mind, attention is drawn to FIG. 2 illustrating a process of high-level synthesis in accordance with certain embodiments of the present invention.

Typically, at the functional level of abstraction, a circuit (or sub-component of a circuit) can be described in terms of inputs to the circuit, outputs from the circuit, and the processes (and their conditions) which are performed by the circuit and thereby transform the input signals into the output signals. The non-limiting example of functional description is further illustrated with reference to FIG. 3.

In accordance with certain embodiments of the present invention, the process of high-level synthesis starts by first obtaining from the functional description control path elements 202, data paths elements 203 and a set of rules 201 describing functional behavior of the circuit. The set of rules may include also conditions comprised in the functional description. Some of the rules may be related to the data path and/or control path elements, while some rules may represent additional behavior constrains introduced by a designer.

Obtaining data path and control path elements from the functional description is well known in the art and described, for example, in Wolf, Wayne, *FPGA-Based System Design*, Prentice-Hall Publishers, Inc., 2004. This process may be done entirely automatically, automatically with a designer intervention and entirely manually. In certain embodiments of the present invention a designer may start to specify data and control path elements having functional description or alike just in mind.

The data path comprises at least one of the following:

Operational elements responsible for arithmetic, logical or relational operations, e.g. adders, multiplexers, etc.

Storage elements representing assignment operations associated with variables and signals e.g. hardware registers, FIFOs, latches, etc.

Call elements denoting calls to subprogram modules.

Interfaces, e.g. bus interface, module interface, etc.

Others may also apply.

The data path elements may contain variables or signals explicitly controlling other design elements (e.g. bus MSB bit controlling a mux operation).

The control path comprises elements responsible for operations, like conditionals constructs, loop constructs, sequencing and other notations controlling the data path elements and/or derivates thereof.

The control path comprises at least one of the following:

variables which control some other element;

start conditions and end conditions (in pairs or separately);

unresolved variables;

data path validity indications;

others may also apply

As a result of this process, all design elements shall be specified as data path or control path elements. The control path elements may be a function from other elements and depend, for example, on values of input data, existence of valid data at inputs or outputs, results of a function applied to the inputs, etc. As a result, the control path may comprise unresolved variables, i.e. having no explicit expression within the data path, control path and/or their combination. It is important to note that in accordance with certain aspects of the present invention, all unresolved variables shall be derived as control path elements.

In accordance with certain embodiments of the present invention, the next step of the high-level synthesis is extracting 204 the unresolved variables in accordance with the set of rules 201. This step is followed by valid state processing, wherein at least one input to the processing comprises at least one unresolved variable. The valid state processing is further detailed with reference to FIG. 4 and results in definition of valid states of unresolved variables and possible transitions, thus enabling the state machine formulation 206. The formulated state machine is processed to provide corresponding resolution of the variables. Thus, control path elements may be fully specified for resulting description 207. In accordance with certain embodiments of the present invention the processing is providing in a correctness-preserving manner as further detailed with reference to FIG. 4.

Figure 3A:
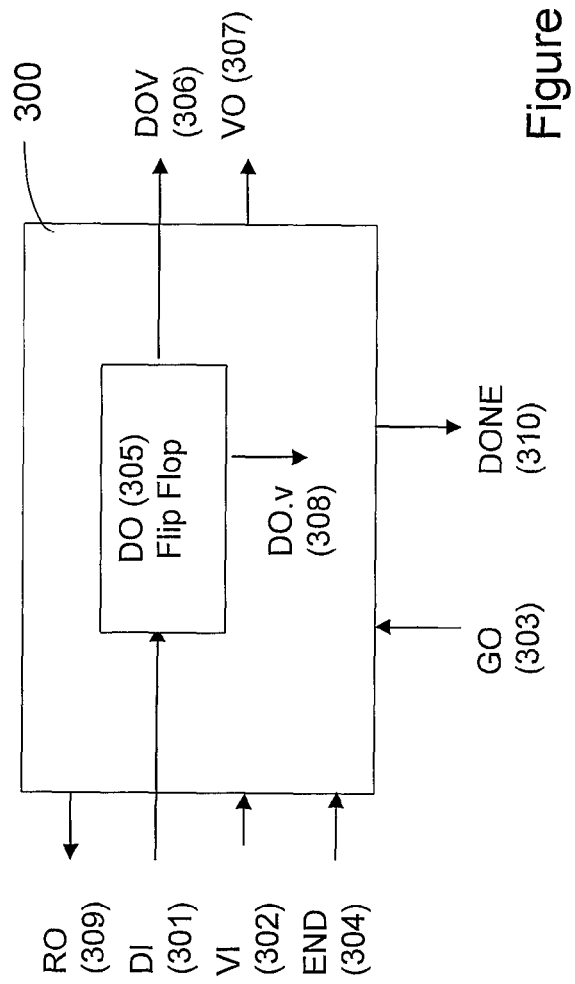
FIGS. 3a and 3b illustrate a schematic functional description of an exemplary electronic circuit.
Figure 3B:
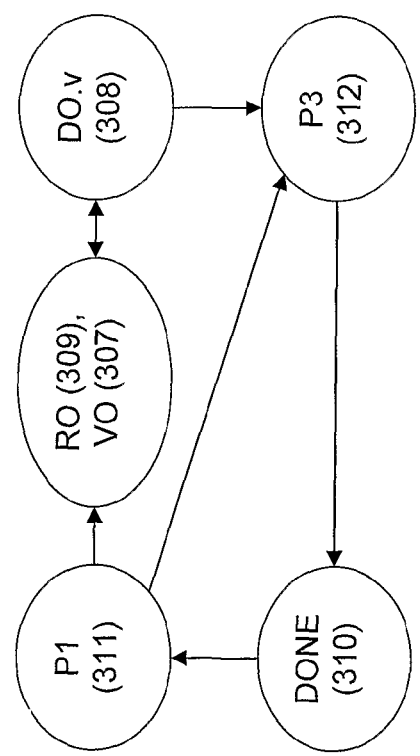

Referring to FIGS. 3a and 3b, there are illustrated, by way of non-limiting example, a schematic functional description of an exemplary circuit. FIG. 3a schematically illustrates inputs, outputs and the data path structure of the circuit, wherein FIG. 3b illustrates a relationship of variables thereof.

As illustrated in FIG. 3a, the exemplary Flip-Flop circuit 300 has the following elements:
DI (Data In) input signal (represents storage element value to be sampled by DO upon certain conditions) 301;
VI (Valid In) input signal 302
"GO" input signal 303
"END" input signal 304
DO (Data Out) output signal (represents storage element value to be sampled by DOV upon certain conditions) 305
DOV (Data Out Virtual) external reflected signal (represents storage element which samples DO upon certain conditions) 306
VO (Valid Out) output signal 307
RO (Ready-out) output signal 309
"DONE" output signal 310
DO.v signal of internal validation of DO output signal 308

The following design rules describe the required functional behavior of the exemplary circuit:
1) Asserting of one clock pulsed "GO" input signal starts off receiving the input data (DI) signal;
2) Asserting of one clock pulsed "END" input signal ends off receiving the input data (DI) signal;
3) Data must be transferred from the input to the output (from DI to DO) if P1 is true and conditioned with the following: VI input signal is provided together with the RO output signal and must not be transferred otherwise;
4) "P1" is defined as "true" the cycle following the "GO" cycle and until end of the "END" cycle;
5) An availability of the output data (DO) for further processing is subject to provision of VO signal;
6) "P3" is defined as "true" the cycle following last P1 true cycle until DO contains no valid data, i.e. DO.v is false;
7) Asserting of one clock pulsed "DONE" signal shall be provided in the cycle following P3 last true cycle.

The following rules describe design criteria further detailed with reference to FIG. 4.
8) Data should not be overridden or generated within the circuit;
9) The "GO" signal cannot be re-asserted until assertion of DONE signal (example of design constrains introduced by designer).
10) Data should be accepted (thus, sampled from DI into DO) whenever possible and be provided for DOV whenever possible (subject to rule 8).

Accordingly, FIG. 3b illustrates the relationship of variables for the exemplary circuit with reference to FIG. 3a and the above requirements.

An arrow directed from variable A to variable B means that variable A influences variable B, dual directed arrow means that variables A and B influence each other or their influencing state cannot be determined a-priori (e.g. unresolved variables in some situations).

In accordance with rules 4 and 6 above, P1 (311) and P3 (312) represent start and end conditions of the circuit operation process.

Accordingly, from the above functional description of the exemplary circuit, one can derive the data path elements DI, DO, DOV controlled by the control path elements VI, VO, RO, GO, END, DONE and DO.v. Among these control path elements RO, VO and DO.v have no explicit expressions and, hence, are unresolved variables. The other control path elements have explicit expression assignments: e.g. DO will sample DI under rule 3 condition supervision, DOV will sample DO under rule 5, DONE is generated according to rule 7, P1 and P3 are generated according to rules 4 and 6 respectively.

The obtained data path and control path elements are further processed in order to accomplish a state machine formulation. The states of the formulated state machine shall represent combinations of unresolved variables facilitating transitions satisfying design rules describing functional behavior of the circuit (e.g. illustrated with reference to FIG. 3a). The transitions shall also match correctness-preserving design criteria as will be further detailed with reference to FIG. 4. In certain embodiments of the present invention, some of the states of the formulated state machine may represent combinations of resolved and unresolved variables and/or some of the states may represent only resolved variables.

Figure 4:
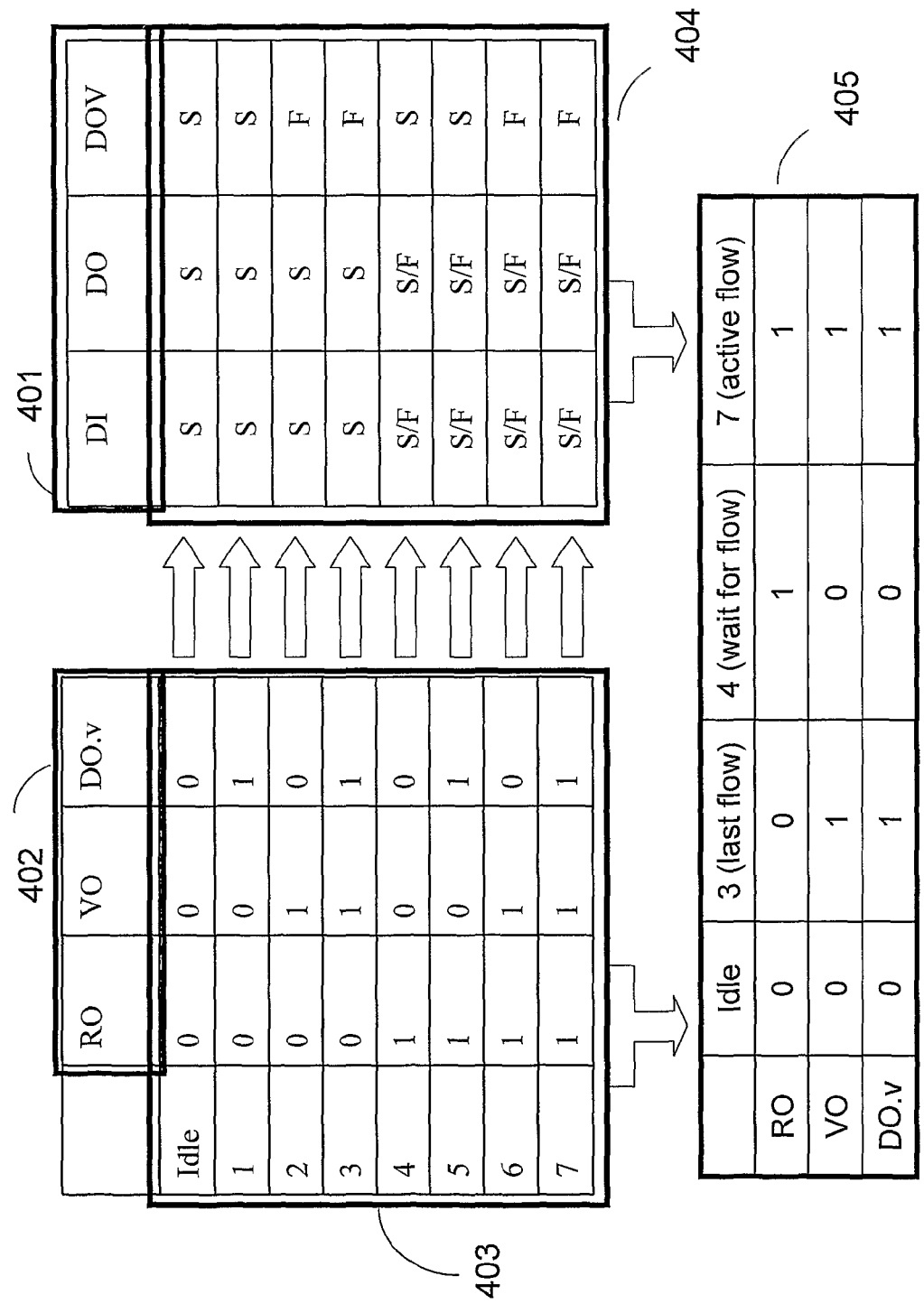
FIG. 4 illustrates a valid state processor in accordance with certain embodiments of the present invention.

The corresponding valid state processor (VSP) is illustrated in FIG. 4 by way of non-limiting example. The VSP comprises at least two categories of inputs:
a data path input 401 comprising data path elements (DI, DO, DOV) and
a control path input 402 comprising unresolved variables (RO, VO and DO.v) controlling the data path elements. The control path input may comprise, also, the resolved variables or part of them.

Please note that all data path elements comprised in the data path input shall be related to the same data flow (or its part) and all elements of the processing dataflow (or its part) shall be comprised in said input 401. Accordingly, the control path input shall comprise all unresolved variables controlling input data path elements. For a complicated data flow (e.g. split, merged, large, etc.) and/or for a control flow with large amount of unresolved variables, the data path and the control path inputs may be divided into several parts for sub-processing in a similar manner.

The VSP asserts probable values (states) for the unresolved variables comprised in the control path input and specifies potential combinations of said values. In the illustrated example a state table 403 includes possible combinations of probable states (Idle, 1-7) of unresolved variables comprised in the control path input for the exemplary circuit illustrated with reference to FIGS. 3a and 3b. Each of the illustrated unresolved variables may have 2 states: an active state (denoted as 1) facilitating a flow of the corresponding data path elements, and a passive state (denoted as 0) preventing the flow of the corresponding data path elements.

The examples of active and passive states of the unresolved variables for the exemplary circuit illustrated with reference to FIGS. 3a and 3b, are illustrated in Table 1.

TABLE 1

|  | RO | VO | DO.v |
|---|---|---|---|
| Active state (1) | implied possible data movement (if VI = 1) | forces output data sampling | implies data existence in a storage element |
| Passive state (0) | forces DO not to sample DI | forces DO not to be sampled | forces DO to be empty (no valid data) |

The idle state in the state table 403 corresponds to passive states (0) of all of its input elements. In a conflict case (e.g. if there are at least two expressions comprising the same variable, while the same value of the variable may cause different (passive or active) states in different expressions), any of the expressions may be selected for defining the passive state of that variable. If it follows that the resulting state machine cannot be realized, the contradicting expression shall be selected for defining the idle state, and the state generation process shall be re-started. In a case where state machine cannot be realized, a user can promptly alter design specifications.

In accordance with certain embodiments of the present invention, the VSP processes all specified combination of probable states of the unresolved variables in order to derive the valid states (combinations) of said variables.

Two combinations of probable states of unresolved variables are considered to be valid if the data flow corresponding to the transition between the states meets predefined design criteria and satisfies predefined design rules describing at least functional behavior of the circuit (referred hereinafter as "legal transition").

In accordance with certain embodiments of the present invention, the processing may be provided as following:
  a) VSP starts processing from the idle state and processes the combinations of probable values of unresolved variables until found all states enabling a legal transition from the idle state;
  b) VSP continues the processing in respect of all pairs of probable states, wherein one of the states in the pair is the last previously derived valid state, until found all state enabling a legal transition from these states;
  c) VSP repeats the processing in a manner described in b) until no new valid state can be derived.

It should be noted that the invention is not bound by the specific algorithm of processing the combination of probable values of the unresolved variables in order to derive the valid states. It should be also noted that in general cases, after and/or during deriving of valid state, the state machine formulation may be done (or reduced thereof) by different known techniques (see e.g. "Formal Hardware Verification with BDDs: An Introduction," *IEEE Pacific Rim Conference on Communications, Computers, and Signal Processing* (*PACRIM*), pp. 677-682, 1997).

In accordance with certain embodiments of the present invention, the predefined design criteria shall enable correctness-preserving transitions between the valid states. The criteria may comprise the following requirements:
  eliminate logic contradiction, i.e. the data flow between the valid states shall not cause any simultaneous assertion of a statement and its negation and/or any violation of a design rule (see, e.g., "Foundations of Digital Logic Design" World Scientific, 1998 for a digital logic design introduction);
  keep data integrity of the data flow in accordance with requirements of a specific design (e.g. in bus transaction the data flow between two valid states shall be preserved from data generation and/or data overridden; data flow may not be preserved from occasional data sampling by an interrupt signal thus loosing some data; data flow may not be preserved from a random number generator in which data is generated inside a data path, etc.);
  keep data flow enabling in accordance with requirements of a specific design, i.e. data flow shall be enabled whenever possible subject to design rules (e.g. data flow shall be always enabled if new data is introduced and disabled for other conditions thus eliminating "holes" in the data flow).
  keep various demands and constrains introduced by user as additional design rules and functionality, etc. (e.g. requirements introduced in the rule 9).

Accordingly, VSP specifies data path elements being controlled by the unresolved variables and, for each of the specified combinations of the probable states of the unresolved variables, analyzes matching of the resulting data flow between a pair of combinations to the design rules and the design criteria, and specifies the valid combinations 405 of the unresolved variables. The analysis of resulting data flow shall be provided for all combination of input conditions (including resolved variables and respective probable values of unresolved variables).

In accordance with certain embodiments of the present invention, the analysis of the resulting data flow may comprise specification, in respect of each of the specified combinations of the probable states of the unresolved variables, of resulting behavior states of the data path elements 404 in accordance with design rules, and further analysis of matching the resulting behavior states to the design criteria.

A data path element may have 3 states describing the data flow behavior:
  Stop (S) when data movement is not possible;
  Flow (F) when data movement is compulsory; and
  Stop/Flow (S/F) when data movement is possible but not compulsory.

The resulting behavior states of the data flow elements 404 are illustrated in FIG. 4 by way of non-limiting example:
  the states of DOV data path element, corresponding to all combinations of probable states where VO=0 (Idle, 1, 4 and 5) shall be S; and corresponding to all combinations of probable states where VO=1 (2, 3, 6, and 7) shall be F (data flow is compulsory), as availability of the output data (DO) for further processing by an external circuit (DOV sampling) is subject of VO provision, (see rule #5 with reference to FIG. 3);
  the states of DO data path element, corresponding to all combinations of probable states where RO=0 (Idle, 1, 2 and 3) shall be S; and corresponding to all combinations of probable states where RO=1 (4, 5, 6 and 7) shall be S/F (data flow is possible if VI=1), as the data cannot be transferred from the input to the output (from DI to DO) without asserting of RO signal (see rule #3 with reference to FIG. 3);
  the states of DI data path elements are similar to those of DO data path element Thus, in accordance with certain embodiments of the present invention, the resulting behavior states of the data path elements are defined for each combination of the probable states of the unresolved variables subject to specified design rules. The valid state processor may be configured to derive valid states of unresolved variables 405 by processing the resulting behavior states 404 of data path elements in accordance with design criteria.

Bearing this in mind, attention is drawn to non-limiting example of processing the combinations of unresolved variables 403 and corresponding data flow resulting in the valid combinations of the unresolved variables (valid states) 405. The processing is provided subject to design criteria formulated above and considering given design rules 1-10 detailed with reference to FIG. 3*a* and input conditions. The similar reasoning in the square breaks is related to analysis based on behavior states of the data path elements.

Idle State

Assuming next P1=0 (VI input is not relevant for the Idle state). GO is possible according to design criteria (constrain introduced by a designer in rule (9), educing may be provided, for example, by techniques described in the referred above "Formal Hardware Verification with BDDs: An Introduction,"). Combinations 4-7 fail on logic contradiction with rule (3) as P=0 means that no information flow is possible. Combinations 1 and 3 fail on data integrity (rule 8), as DO.v shall be 0, as in Idle State no data enter DO ["S" state of DO in idle in 404]. Combination 2 fails on data integrity (rule 8) since outer circuit cannot see a valid signal when no data exist in DO [The resulting behavior state of DOV for this combination is "F" meaning that the flow is compulsory. As DO.v=0, no data shall exist in DO, hence the combination fails on data integrity]. Accordingly, when next P1=0, next valid state is Idle again.

Assuming next P1=1. GO is possible according to rule (9) and is compulsory according to rule (4). Combinations 1, 3, 5 and 7 fail on data integrity (rule 8), as no data enter DO in Idle, so DO.v shall be 0 ["S" state of DO in idle in 404]. Combinations 2 and 6 fail on data integrity (rule 8), since outer circuit cannot see a valid signal as no data exist in DO [The resulting behavior state of DOV for these combinations is "F" meaning that the flow is compulsory. As DO.v=0, no data shall exist in DO, hence these combinations fail on data integrity]. Idle combination fails on design flow enabling (rule 10) since input data is blocked for no purpose. Accordingly, when next P=1, next valid state is combination #4.

State #4

Assuming next P1=0. GO is not possible according to rule (9). Combinations 4-7 fail on logic contradiction with rule (3) as P1=0 means that no flow is possible. Combination 2 fails on data integrity (rule 8) since outer circuit can't see a valid signal when no data exist in DO. [The resulting behavior state of DOV for this combination is "F" meaning that the flow is compulsory. As DO.v=0, no data shall exist in DO, hence the combination fails on data integrity]. If VI=0, then combinations 1 and 3 fail on data integrity as DO.v must be 0 if no new data has been entered ["S" state of DO in state 4 (when VI=0) in 404]. Accordingly, next valid state is Idle. If VI=1, then combinations Idle and 2 fail on data integrity as DO.v must be 1 if new data has been entered ["F" state of DO in state 4 (when VI=1) in 404]. Combination 1 fails on design flow enabling for no purpose. Accordingly, next valid state is combination #4. If VI=1, then combinations Idle, 2, 4 and 6 fail on data integrity. DO.v must be 1 if new data has been entered ["F" state of DO in state 4 (when VI=1) in 404]. Combinations 1 and 5 fail on design flow enabling (rule 10) since output data is blocked for no purpose. Combination 3 fails on design flow enabling (rule 10) since input data is blocked for no purpose. Accordingly, next valid state is combination #7.

In a similar manner the processing is provided for combinations 3 and 7. Table 2 below summarizes the illustrated steps of the processing. "LC" stands for a validation failure because of logic contradiction, "DI" stands for a validation failure because of data integrity and "DF" stands for a validation failure because of design flow requirements.

| Valid states | Condition | Combinations | | | | | | | | Next Valid States |
|---|---|---|---|---|---|---|---|---|---|---|
| | | Idle | 1 | 2 | 3 | 4 | 5 | 6 | 7 | |
| Idle | next P1 = 0 | | DI | DI | DI | LC | LC | LC | LC | Idle |
| Idle, | Next P1 = 1 | DF | DI | DI | DI | | DI | DI | DI | State #4 |
| State #4, | next P1 = 0; VI = 0 | | DI | DI | DI | LC | LC | LC | LC | Idle |
| State #4 | next P1 = 0; VI = 1 | DI | DF | DI | | LC | LC | LC | LC | State #3 |
| State #4, | next P1 = 1; VI = 0 | DF | DI | DI | DI | | DI | DI | DI | State #4 |
| State #4 | next P1 = 1; VI = 1 | DI | DF | DI | DF | DI | DF | DI | | State #7 |
| State #7 | next P1 = 0; VI = 0 | | DI | DI | DI | LC | LC | LC | LC | Idle |
| State #7 | next P1 = 0; VI = 1 | DI | DF | DI | | LC | LC | LC | LC | State #3 |
| State #7 | Next P1 = 1; VI = 0 | DF | DI | DI | DI | | DI | DI | DI | State #4 |
| State #7 | next P1 = 1; VI = 1 | DI | DF | DI | DF | DI | DF | DI | | State #7 |
| State #3 | Always | | DI | DI | DI | LC | LC | LC | LC | Idle |

It should be noted that the invention is not bound by the specific structure of the valid state processor and data representation described with reference to FIG. 4. Those versed in the art will readily appreciate that the invention is, likewise, applicable to any other processing with equivalent and/or modified functionality which may be consolidated or divided in another manner.

Figure 5:
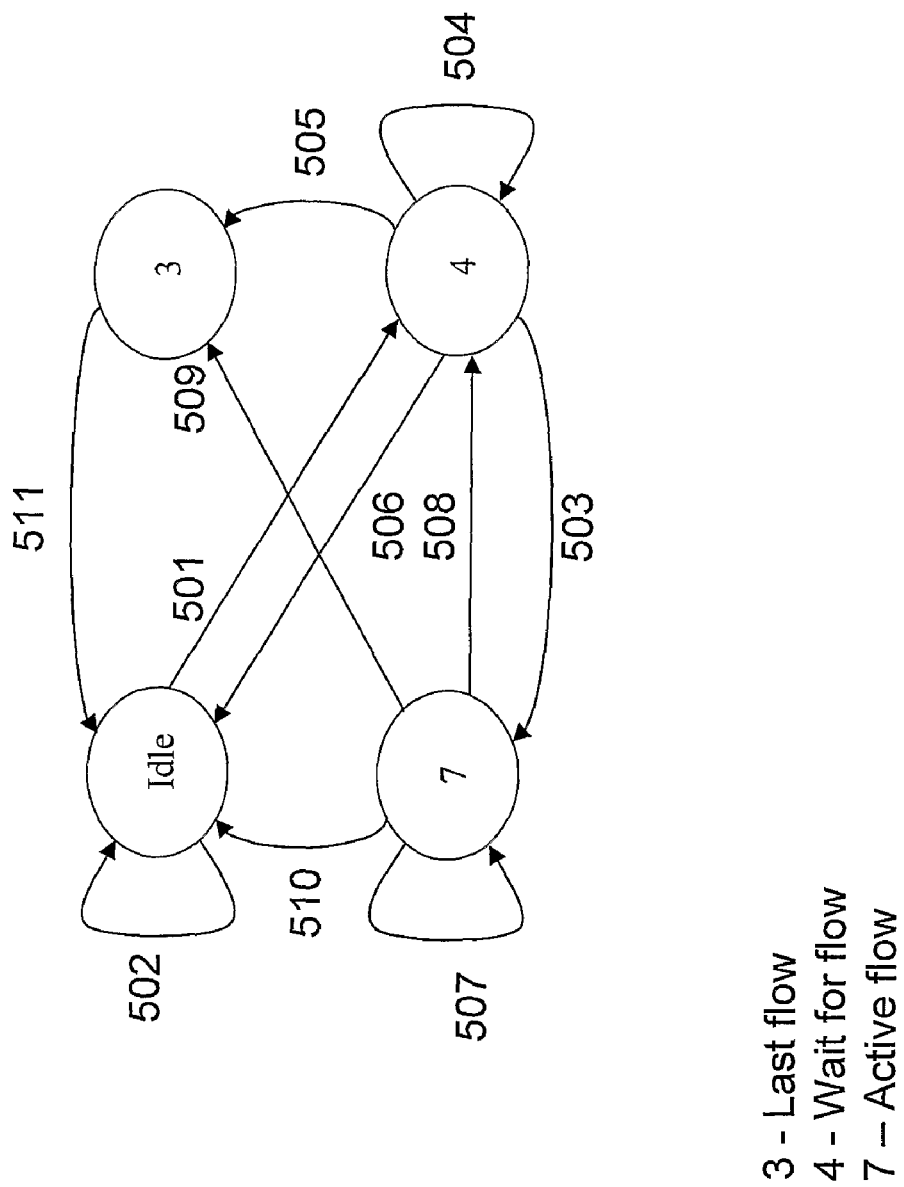
FIG. 5 illustrates a state machine formulated in accordance with certain embodiments of the present invention.

The above processing and deriving of valid states facilitates formulation of behavior state machine illustrated in FIG. 5 by way of non-limiting example.

It should be noted that the term "state machine" used in this patent specification should be expansively construed to cover any kind of a model of sequential behavior composed of states and transitions, when behavior cannot be defined by the knowledge of inputs only, but depends at least on the sequence of input changes. The model may be represented in different forms as, for example, finite-state machines, control & data graphs, state diagrams, behavior tables, the models used in PLC languages, Petry-nets, etc. A state stores information about the past, i.e. it reflects the input changes from the system start to the present moment. A transition indicates a state change and is described by a condition that would need to be fulfilled to enable the transition.

The state machine illustrated in FIG. 5 comprises the valid states presented as nodes (Idle, 3, 4 and 7 per numeration of FIG. 4) and transitions between them presented as arcs connecting the nodes. This exemplary state machine corresponds to the valid state derived by the processing illustrated, by way of non-limiting example, with reference to FIG. 4. Since the variables' dependencies and their explicit expressions in the illustrated example are fairly simple, the state machine may be formulated by identifying possible values of next state of P1 condition.

P1 logic rises to '1' with GO and returns to '0' with END (rule 4). Next P1 is hence straightforward. P3 logic raises to '1' with P1 active and END while returning to '0' with !DO.v (rule 6). DONE logic raises for a cycle if P3 is active and !DO.v is satisfied (rule 7). DO.v, RO and VO are determined easily from the above resulted state machine. DO.v is '1' in states 3 or 7. RO is '1' in states 4 or 7. VO is '1' in states 3 or 7.

The following Table 3 summarizes the transitions illustrated in FIG. 5. The names of states may be assigned in various ways, for example information flow situations (as illustrated in FIG. 5), user defined rules, etc. State machine inputs are: P1 (which convey GO and END signals in it) and VI.

TABLE 3

| Arc # | Arc direction | Condition | Comments |
|---|---|---|---|
| 501 | From `IDLE to WAIT_FOR_FLOW | Next P1 = 1 | Operation start condition exists |
| 502 | From `IDLE to `IDLE: | Next P1 = 0 | |
| 503 | From WAIT_FOR_FLOW to ACTIVE_FLOW | Next P1 = 1 and VI = 1 | New data coming in |
| 504 | From WAIT_FOR_FLOW to WAIT_FOR_FLOW: | Next P1 = 1 and VI = 0 | |
| 505 | From WAIT_FOR_FLOW to LAST_FLOW | VI = 1 and next P1 = 0 | Last data coming in |
| 506 | From WAIT_FOR_FLOW to IDLE | VI = 0 and next P1 = 0 | |
| 507 | From `ACTIVE_FLOW to ACTIVE_FLOW | Next P1 = 1 and VI = 1 | New data coining in while old data is taken out |
| 508 | From `ACTIVE_FLOW to WAIT_FOR_FLOW | Next P1 = 1 and VI = 0 | |
| 509 | From `ACTIVE_FLOW to LAST_FLOW | VI = 1 and next P1 = 0 | Last data coming in while old data is taken out |
| 510 | From `ACTIVE_FLOW to IDLE | VI = 0 and next P1 = 0 | |
| 511 | From LAST_FLOW to IDLE | "always" (no condition) | |

Thus, in accordance with certain embodiments of the present invention, the formulated state machine enables resolving of variables having no explicit expressions and fully specifying the control path elements.

The method disclosed in the present invention may be done entirely automatically, automatically with a designer intervention at any step, and entirely manually and may use any programmable language suitable for design of electronic circuits. The principles of the present invention also allow formulation of special language optimized for certain aspects of the present invention.

Referring to FIG. 6, there is illustrated, by way of non-limiting example, functional behavior rules describing design functionality in a meta-language. Connections between the illustrated code lines and the design rules illustrated with reference to FIG. 3a are the following:

A structure section 601 comprises behavior rules and conditions related to the data path elements; a control section 602 comprises behavior rules and conditions related to the control path elements and an attributes section 603 comprises design criteria conveys general design information.

Line 1 corresponds to rule 3: DI will be sampled into DO under P1 control condition.

Line 2 corresponds to rule 5: DO will be sampled provided VO is asserted. This shows alternative syntax as the VO condition might be detailed in the control section.

Line 3 corresponds to rule 7: DONE signal is a sampled version of the end condition of P3 control definition.

Line 4 corresponds to rule 4: P1 is asserted between GO and END signals and the flow associated with this condition is further conditioned by the existence of VI && RO logical combination. The virtual indication states that the relevant virtual condition (i.e. VI && RO) is the only condition upon which the input is considered as valid by the outer circuit.

Line 5 corresponds to rule 6: P3 is asserted between end condition of P1 control condition and the non-validity of the DO data element.

Line 6 corresponds to rule 8: data cannot be generated inside the circuit nor can it be overwritten and ignored (design criterion of data integrity).

Line 7 corresponds to rule 9: external condition exists for GO assertion. GO can be asserted only if DONE was asserted after GO previous assertion. This kind of condition limits the possible design state machine transitions.

The certain embodiments of the present invention facilitate easily structured and short specification of the output structural level description. The following Verilog RTL code illustrates, by way of non-limiting example and without general definitions (e.g. module, inputs, outputs), structural level description of the exemplary circuit illustrated with reference to FIG. 3.

```
// States encoding
`define IDLE                2'b00
`define WAIT_FOR_FLOW       2'b01
`define ACTIVE_FLOW 2'b10
`define LAST_FLOW           2'b11
// Design registers
reg     DO, P1, P3, DONE;
reg[1:0]   state;
// Design wires
wire              DO_valid, RO, VO, next_P1;
reg [1:0]  next__state;
// Information flow through DO
always @ (posedge clock or negedge reset) begin
     if(!reset)           DO <= 0;
     else if(VI && RO)    DO <= DI;
end
// State machine logic controlling DO flow
always @ (state or next_P1 or VI) begin case (state)
   `IDLE:           if      (next_P1)              next_state = `WAIT_FOR_FLOW;
                    else                  next_state = `IDLE;
   `WAIT FOR FLOW:  if    ( next_P1 && VI)  next_state = `ACTIVE_FLOW;
                    else if ( next_P1 && !VI)   next_state = `WAIT_FOR_FLOW;
                    else if (!next_P1 && VI)    next_state = `LAST_FLOW;
                    else                 next_state = `IDLE;
   `ACTIVE_FLOW:    if    ( next_P1 && VI)  next_state = `ACTIVE_FLOW;
                    else if ( next_P1 && !VI)
next_state=`WAIT_FOR_FLOW;
                    else if (!next_P1 && VI)   next_state = `LAST_FLOW;
                    else                  next_state = `IDLE;
   `LAST_FLOW:                    next_state = `IDLE;
   endcase end
   always @ (posedge clock or negedge reset) begin
       if(!reset)   state <= `IDLE;
```

-continued

```
        else    state <= next_state;
    end
// Information flow control signals generation
    assign DO_valid = (state == `LAST_FLOW)    || (state == `ACTIVE_FLOW);
    assign RO       = (state == `WAIT_FOR_FLOW) || (state == `ACTIVE_FLOW);
    assign VO       = (state == `LAST_FLOW)    || (state == `ACTIVE_FLOW);
// Misc. control generation
// GO is valid out of(go, done)
    assign next_P1 = GO ? 1 : (END ? 0 : P1);
    always @ (posedge clock or negedge reset) begin
        if(!reset) begin
            P1   <= 0;
            P3   <= 0;
        end
        else begin
                                   P1   <= next_P1;
            if(P1 && END)          P3   <= 1;
            else if(!DO_valid)     P3   <= 0;
        end
    end
// Output signals generation
    always @ (posedge clock or negedge reset) begin
        if(!reset)
            DONE<= 0;
        else begin
            if(P3 && !DO_valid)    DONE  <= 1;
            else                   DONE  <= 0;
        end
    end
```

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the concept upon which this disclosure is based may readily be utilized as a basis for designing other structures, methods, and systems for carrying out the several purposes of the present invention.

Those skilled in the art will readily appreciate that various modifications and changes can be applied to the embodiments of the invention as hereinbefore described without departing from its scope, defined in and by the appended claims.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

The invention claimed is:

1. A method of designing a structural level description of an electronic circuit, the method comprising:
    (a) obtaining data path and control path elements specifying the electronic circuit, wherein at least one control path element is provided in a form of unresolved variable;
    (b) obtaining a plurality of rules describing, at least, a functional behavior of the electronic circuit;
    (c) extracting a plurality of unresolved variables among the control path elements;
    (d) automated processing data path and control path elements for accomplishing a state machine formulation, wherein the states of the state machine include states representing at least combinations of unresolved variables and corresponding transitions satisfying said plurality of rules and predefined design criteria;
    wherein the automated processing comprises:
    (i) asserting probable values for unresolved variables among the plurality of unresolved variables and specifying potential combinations of said values;
    (ii) specifying data path elements being controlled by said plurality of unresolved variables;
    (iii) validating, in respect of each of the specified combinations of values of unresolved variables among the plurality of the unresolved variables, whether said data path elements comply with said plurality of rules and predefined design criteria and, thus giving rise to valid combinations of values of the plurality of unresolved variables to be specified in states of said state machine.

2. The method of claim 1 wherein the probable values of the unresolved variables are selected from the group comprising:
    (a) a value facilitating a flow comprising data path elements being controlled by the unresolved variable;
    (b) a value preventing a flow comprising data path elements being controlled by the unresolved variable.

3. The method of claim 1 wherein the probable values of unresolved variables are asserting to all unresolved variables comprised in the plurality of unresolved variables.

4. The method of claim 1 comprising specifying all potential combinations of the probable values of unresolved variables among the plurality of unresolved variables.

5. The method of claim 1 comprising specifying all data path elements being controlled by said plurality of unresolved variables.

6. The method of claim 1 wherein said validating is provided in respect of each pair of the specified combinations of values of unresolved variables.

7. A method of designing a structural level description of an electronic circuit, the method comprising:
    (a) obtaining data path and control path elements specifying the electronic circuit, wherein at least one control path element is provided in a form of unresolved variable;
    (b) obtaining a plurality of rules describing, at least, a functional behavior of the electronic circuit;
    (c) extracting a plurality of unresolved variables among the control path elements;
    (d) automated processing data path and control path elements for accomplishing a state machine formulation, wherein the states of the state machine include states representing at least combinations of unresolved variables and corresponding transitions satisfying said plurality of rules and predefined design criteria;
    wherein the automated processing comprises:
    (i) asserting probable values for unresolved variables among the plurality of unresolved variables and specifying potential combinations of said values;
    (ii) specifying data path elements being controlled by said plurality of unresolved variables;
    (iii) defining combinations of resulting states of the data path elements in respect of each specified combination of values of the plurality of unresolved variables in accordance with the plurality of rules;
    (iv) validating, in respect of each specified combination of values of unresolved variables among the plurality of unresolved variables, if the corresponding combination of said resulting states of the data path elements meet predefined design criteria, thus giving rise to valid combinations of values of the plurality of unresolved variables to be specified in states of said state machine.

8. The method of claim 7 wherein the probable values of the unresolved variables are selected from the group comprising:
    (a) a value facilitating a flow comprising data path elements being controlled by the unresolved variable;
    (b) a value preventing a flow comprising data path elements being controlled by the unresolved variable.

9. The method of claim 7 wherein the probable values of unresolved variables are asserting to all unresolved variables comprised in the plurality of unresolved variables.

10. The method of claim 7 comprising specifying all potential combinations of the probable values of unresolved variables among the plurality of unresolved variables.

11. The method of claim 7 comprising specifying all data path elements being controlled by said plurality of unresolved variables.

12. The method of claim 7 wherein said validating is provided in respect of each pair of the specified combinations of values of unresolved variables.

13. The method of claim 7 wherein the resulting states of the data path elements are selected from the group comprising:
    (a) a state characterized by that data movement is not possible;
    (b) a state characterized by that data movement is compulsory;
    (c) a state characterized by that data movement is possible but not compulsory.

14. A method of designing a structural level description of an electronic circuit, the method comprising:
    (a) obtaining data path and control path elements specifying the electronic circuit, wherein at least one control path element is provided in a form of unresolved variable;
    (b) obtaining a plurality of rules describing, at least, a functional behavior of the electronic circuit;
    (c) extracting a plurality of unresolved variables among the control path elements;
    (d) automated processing data path and control path elements for accomplishing a state machine formulation, wherein the states of the state machine include states representing at least combinations of unresolved variables and corresponding transitions satisfying said plurality of rules and predefined design criteria;
    wherein the automated processing comprises:
    (i) specifying data path elements;
    (ii) specifying control path elements controlling the specified data path elements;
    (iii) asserting probable values for unresolved variables among the plurality of unresolved variables corresponding to the specified control path elements and specifying potential combinations of said values;
    (iv) validating, in respect of each of the specified combinations of values of unresolved variables among the plurality of the unresolved variables, whether said data path elements comply with said plurality of rules and predefined design criteria and, thus giving rise to valid combinations of values of the plurality of unresolved variables to be specified in states of said state machine.

15. The method of claim 14 wherein the probable values of the unresolved variables are selected from the group comprising:
    (a) a value facilitating a flow comprising data path elements being controlled by the unresolved variable;
    (b) a value preventing a flow comprising data path elements being controlled by the unresolved variable.

16. The method of claim 14 wherein the probable values of unresolved variables are asserting to all unresolved variables comprised in said plurality of unresolved variables.

17. The method of claim 14 comprising specifying all potential combinations of the probable values of unresolved variables among said plurality of unresolved variables.

18. The method of claim 14 comprising specifying all control path elements controlling the specified data path elements.

19. The method of claim 14 wherein said validating is provided in respect of each pair of the specified combinations of values of unresolved variables.

20. A method of designing a structural level description of an electronic circuit, the method comprising:
    (a) obtaining data path and control path elements specifying the electronic circuit, wherein at least one control path element is provided in a form of unresolved variable;
    (b) obtaining a plurality of rules describing, at least, a functional behavior of the electronic circuit;
    (c) extracting a plurality of unresolved variables among the control path elements;
    (d) automated processing data path and control path elements for accomplishing a state machine formulation, wherein the states of the state machine include states representing at least combinations of unresolved variables and corresponding transitions satisfying said plurality of rules and predefined design criteria;
    wherein the automated processing comprises:
    (i) specifying data path elements;
    (ii) specifying control path elements controlling the specified data path elements;
    (iii) asserting probable values for unresolved variables among the plurality of unresolved variables corresponding to the specified control path elements and specifying potential combinations of said values;
    (iv) defining combinations of resulting states of the data path elements in respect of each specified combination of values of the plurality of unresolved variables in accordance with the plurality of rules;
    (v) validating, in respect of each specified combination of values of unresolved variables among the plurality of unresolved variables, if the corresponding combination of said resulting states of the data path elements meet predefined design criteria, thus giving rise to valid combinations of values of the plurality of unresolved variables to be specified in states of said state machine.

21. The method of claim 20 wherein the probable values of the unresolved variables are selected from the group comprising:
    (a) a value facilitating a flow comprising data path elements being controlled by the unresolved variable;
    (b) a value preventing a flow comprising data path elements being controlled by the unresolved variable.

22. The method of claim 20 wherein the probable values of unresolved variables are asserting to all unresolved variables comprised in said plurality of unresolved variables.

23. The method of claim 20 comprising specifying all potential combinations of the probable values of unresolved variables among said plurality of unresolved variables.

24. The method of claim 20 comprising specifying all control path elements controlling the specified data path elements.

25. The method of claim 20 wherein said validating is provided in respect of each pair of the specified combinations of values of unresolved variables.

26. The method of claim 20 wherein the resulting states of the data path elements are selected from the group comprising:
(a) a state characterized by that data movement is not possible;
(b) a state characterized by that data movement is compulsory;
(c) a state characterized by that data movement is possible but not compulsory.

27. A program storage device readable by machine, tangibly embodying a program of instructions executable by the machine to perform method steps of designing a structural level description of an electronic circuit, the method comprising:
(a) obtaining data path and control path elements specifying the electronic circuit, wherein at least one control path element is provided in a form of unresolved variable;
(b) obtaining plurality of rules describing, at least, a functional behavior of the electronic circuit;
(c) extracting a plurality of unresolved variables among the control path elements;
(d) automated processing of data path and control path elements for accomplishing a state machine formulation, wherein the states of the state machine are including states representing at least combinations of unresolved variables and corresponding transitions satisfying said plurality of rules and predefined design criteria;
wherein the automated processing comprises:
i) asserting probable values for unresolved variables among the plurality of unresolved variables and specifying potential combinations of said values;
ii) specifying data path elements being controlled by said plurality of unresolved variables;
iii) validating, in respect of each of the specified combinations of values of unresolved variables among the plurality of the unresolved variables, whether said data path elements comply with said plurality of rules and predefined design criteria and, thus giving rise to valid combinations of values of the plurality of unresolved variables to be specified in states of said state machine.

28. A computer program product comprising a computer useable medium having computer readable program code embodied therein of designing a structural level specification description of an electronic circuit, the computer program product comprising:
a) computer readable program code for causing the computer to obtain data path and control path elements specifying the electronic circuit, wherein at least one control path element is provided in a form of unresolved variable;
b) computer readable program code for causing the computer to obtain plurality of rules describing, at least, a functional behavior of the electronic circuit;
c) computer readable program code for causing the computer to extract a plurality of unresolved variables among the control path elements;
d) computer readable program code for causing the computer to automated processing of data path and control path elements for accomplishing a state machine formulation, wherein the states of the state machine are including states representing at least combinations of unresolved variables and corresponding transitions satisfying said plurality of rules and predefined design criteria;
wherein the automated processing comprises:
i) asserting probable values for unresolved variables among the plurality of unresolved variables and specifying potential combinations of said values;
ii) specifying data path elements being controlled by said plurality of unresolved variables;
iii) validating, in respect of each of the specified combinations of values of unresolved variables among the plurality of the unresolved variables, whether said data path elements comply with said plurality of rules and predefined design criteria and, thus giving rise to valid combinations of values of the plurality of unresolved variables to be specified in states of said state machine.

* * * * *